(12) United States Patent
Jeng et al.

(10) Patent No.: US 6,462,483 B1
(45) Date of Patent: Oct. 8, 2002

(54) INDUCTION PLASMA PROCESSING CHAMBER

(75) Inventors: David Guang-Kai Jeng, Hsinchu (TW); Fred Yingyi Chen, Hsinchu (TW); Tsung-Nane Kuo, Hsinchu (TW); Hong-Ji Lee, Hsinchu (TW)

(73) Assignee: Nano-Architect Research Corporation, Hsinchu (TW)

( * ) Notice: Subject to any disclaimer, the term of this patent is extended or adjusted under 35 U.S.C. 154(b) by 0 days.

(21) Appl. No.: 09/442,765

(22) Filed: Nov. 18, 1999

(51) Int. Cl.$^7$ .................................................. H01J 7/24
(52) U.S. Cl. ............................. 315/111.51; 315/111.21
(58) Field of Search ..................... 315/111.51, 111.21, 315/111.81, 346; 156/345

(56) References Cited

U.S. PATENT DOCUMENTS

| | | | |
|---|---|---|---|
| 5,280,154 A | * | 1/1994 | Cuomo et al. ........... 219/121.52 |
| 5,311,103 A | * | 5/1994 | Asmussen et al. ....... 315/111.81 |
| 5,556,521 A | | 9/1996 | Ghanbari ................. 204/192.32 |
| 5,614,055 A | * | 3/1997 | Fairbairn et al. ............ 156/345 |
| 5,622,635 A | | 4/1997 | Cuomo et al. ................ 216/68 |
| 5,736,818 A | * | 4/1998 | Ulczynski et al. ...... 315/111.21 |

OTHER PUBLICATIONS

N. Forgotson, et al., entitled "Inductively Coupled Plasma for Polymer Etching of 200 mm Wafers" J. Vac. Sci Tech. B. 14(2) pp. 732–737 Mar./Apr. 1996.

* cited by examiner

*Primary Examiner*—Don Wong
*Assistant Examiner*—Jimmy T. Vu
(74) *Attorney, Agent, or Firm*—Bacon & Thomas

(57) ABSTRACT

A method and an apparatus of plasma treating a wafer with low capacitive coupling, high induction power density and high uniformity of reactive species were disclosed in this invention. A first embodiment manages a multiturn helical coil to match with an impedance at an RF drive frequency for reducing capacitive coupling. A second embodiment uses a can-like dielectric to prompt plasma species approaching the wafer surface at a low pressure, thus providing higher plasma density and higher etch rate. A third embodiment uses a cap-like dielectric to raise the ceiling above the wafer for improving the plasma generation uniformity in the chamber.

12 Claims, 3 Drawing Sheets

INDUCTION PLASMA PROCESSING CHAMBER

FIELD OF THE INVENTION

The invention relates to a plasma processor and particularly to such a processor consisting of a multiturn helical coil atop an adjustable dielectric ceiling for performing reactive ion etch and chemical vapor deposition.

BACKGROUND ART

Plasma-enhanced semiconductor processes for etching, deposition, resist stripped, passivation, or the like are well known. Generally, plasma may be produced from a low-pressure process gas by inducing an electron flow which ionizes individual gas molecules through the transfer of kinetic energy through individual electron-gas molecule collisions. Most commonly, the electrons are accelerated in an electric field, such as a radiofrequency (RF) electric field. Various structures have been developed to supply RF fields from devices outside of a vacuum chamber of a plasma processor to excite a gas therein to a plasma state. Inductively coupled plasma (ICP) caused by coil is one kind of the devices. ICP offer many processing advantages including high reactive species densities, thus providing high electron density plasma, high process rates, as well as low and controllable sheath voltage. To produce an RF inductively coupled plasma, the coil inductor is adjacent to the chamber. One conventional apparatus was described by Jacob et al. in U.S. Pat. No. 3,705,091, in which the plasma was generated inside a low pressure cylindrical vessel within the helical coil which energized by 13 MHz RF radiation. This apparatus not only has high etch rate performance, but also has serious contamination due to sputtering of the dielectric vessel walls caused by capacitive coupling created by the RF potentials on the coil with the vessel walls.

In U.S. Pat. No. 4,948,458, Ogle et al. disclose the plasma is generated at a low pressure such as 0.1 milliTorr to 5 Torr by using a spiral coil positioned on or adjacent to a planar dielectric called a window. The coil is responsive to an RF source having a frequency in the range of 1 to 100 MHz (typically 13.56 MHz), and is coupled to the RF source with an impedance matching network. According to the disclosure in U.S. Pat. No. 5,619,103, the extra dielectric acts as to reduce the effects of capacitive coupling between the coil and the plasma.

Cuomo et al. in U.S. Pat. No. 5,622,635 discloses a plasma chamber further comprises a conductive shield between a spiral coil or a helical coil and a planar dielectric window. The shield is designed to guide capacitive coupling generated by the coil away from the plasma-window interface.

More effective reduction of capacitive coupling and higher induction power may be attained by using a multiturn coil with the lower turn thereof grounded [Frogotson et al., entitled *"Inductively Coupled Plasma for Polymer Etching of 200 mm Wafers"*, J. Vac. Sci. Technol. B 14(2), pp. 732–737, 1996]. However, as Frogotson et al. taught in this article that the matching network could not properly tune the larger self-inductance of a three-turn 24-cm-diam helical coil with 6 mm cross sectional diameter at the 13.56 MHz drive frequency.

Another problem should be considered in manufacturing plasma processor, that is the uniformity of reactive species such as oxygen ions or radicals in the plasma generation chamber. In some deposition conditions, the chamber pressure tends to be somewhat higher that reduce the mean free path of these reactive species, and results in a nonuniform plasma density due to recombination of the reactive species. One possible solution would be to raise the height of the dielectric ceiling and to increase the height of the coil antenna above the wafer treated. Another possible solution would be to operate the source region at a very low pressure (below 1 milliTorr). In U.S. Pat. No. 5,614,055, Fairbaim et al. discloses a dome-shaped plasma processor to improve the plasma generation uniformity of a oxygen gas via increasing the height of the coil antenna above the wafer treated. U.S. Pat. No. 5,556,521 discloses a sputter etching apparatus having a dome-shaped dielectric extending into the processing chamber toward a substrate, in which a contoured inductive coil is disposed on the dielectric so as to generate dense uniform plasma for an uniform etch rate at low pressure about 1 milliTorr. The contoured inductive coil used in '521 is convex-shaped in the direction of the substrate and thus is somewhat difficult to be made. As a result, the plasma generation uniformity is adversely affected.

SUMMARY OF THE INVENTION

For achieving the goals of low capacitive coupling, high induction power density and high uniformity of reactive species needed by the industry as mentioned above, the present invention provides a multitum (turn number $\geq 4$) coil atop an adjustable dielectric for exciting gases in an RF vacuum plasma processor.

The present invention discloses a plasma processor which includes a four-turn 30-cm-diam helical coil managed to match with an impedance at an RF source of 13.56 MHz. This apparatus of the present invention will reduce the capacitive coupling problem comparing to some similar plasma apparatus.

In accordance with another aspect of the present invention, the helical coil is put into a conformal can-like dielectric to prompt an RF plasma species more approaching the wafer surface at a low pressure (0.001 milliTorr to 10 milliTorr), thus providing higher power density and higher etch rate.

In accordance with further aspect of the present invention, a cap-like dielectric conformal to the helical coil is introduced into the processor. This modification is one skill to raise the dielectric ceiling above the wafer treated for improving the problem of plasma concentration in the chamber under deposition conditions.

An inductively coupled plasma processing chamber constructed in accordance with the present invention comprises a dielectric window having a planar base and an integrally formed upright wall surrounding the planar base.

The present invention also provides a method of increasing a flux of ionic species of an inductively coupled plasma generated under a vacuum pressure of 0.001 to 10.0 milliTorr in a vacuum chamber having a fixed upright height between a bottom plate and a ceiling thereof. The method comprises using a dielectric window, as a part of the ceiling, having a planar base and an integrally formed upright wall surrounding the planar base, when the inductively coupled plasma is generated, wherein the dielectric window is hermetically connected to the ceiling and so that the planar base of the dielectric window extends into the vacuum chamber.

The present invention further provides a method of increasing a plasma generation uniformity of an inductively coupled plasma generated under a vacuum pressure higher than 10.0 milliTorr in a vacuum chamber having a fixed upright height between a bottom plate and a ceiling thereof, which comprises using a dielectric window, as a part of the ceiling, having a planar base and an integrally formed upright wall surrounding the planar base wherein the dielectric window is hermetically connected to the ceiling and so that the planar base of the dielectric window protrudes from the vacuum chamber.

Preferably, the dielectric window is cylindrical.

Preferably, the upright wall has a height from the planar base less than 10 cm, more preferably less than 5 cm.

The inductively coupled plasma processing chamber of the present invention may further comprises a chamber body, in which a free end of the upright wall of the dielectric window is hermetically connected to the chamber body to provide a plasma generation space confined by the dielectric window and the chamber body. Preferably, the chamber body comprises a bottom plate, an upright side wall surrounding the bottom, and a flange at a free end of the upright side wall, wherein the flange extends inwardly from the upright side wall so as to form an aperture above the bottom plate, wherein the dielectric window hermetically seals the aperture. The dielectric window is hermetically connected to the chamber body so that the planar base of the dielectric window either protrudes from the chamber body or extends into the chamber body.

Preferably, a coil is disposed adjacent to the planar base of the dielectric window for bringing about an inductively coupled plasma. More preferably, the coil is a helical coil and the dielectric window is cylindrical, wherein the helical coil is coaxially disposed adjacent to the planar base of the dielectric window.

Further advantageous embodiments of the invention ensue from the features disclosed in the dependent claims.

BRIEF DESCRIPTION OF THE DRAWINGS

Other objectives, features, and advantages of this invention will become apparent from the following detailed description of the preferred but non-limiting embodiments. The description is made with reference to the accompanying drawings in which.

DETAILED DESCRIPTION OF THE PREFERRED EMBODIMENTS

Figure 1:
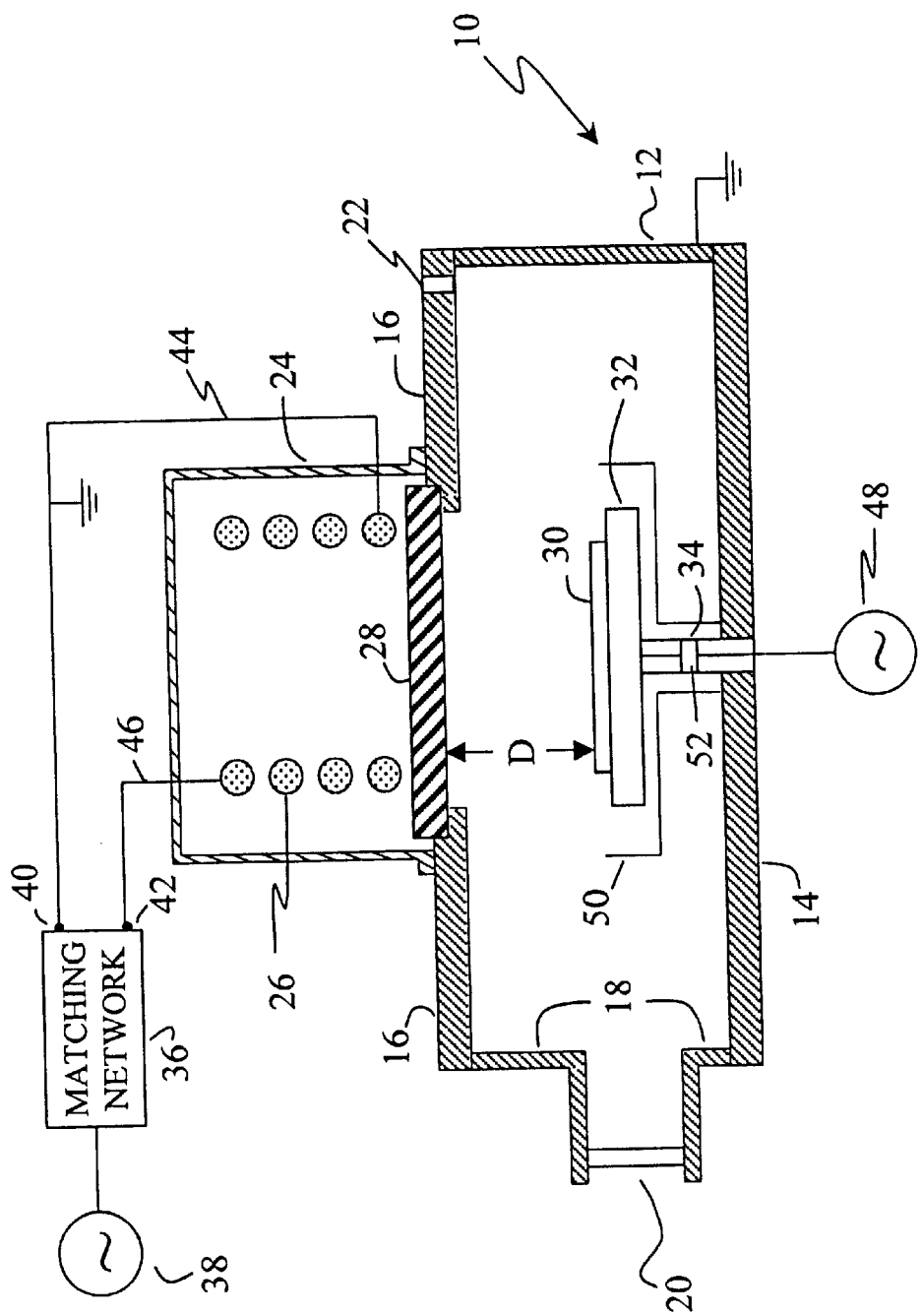
FIG. 1 shows a side cross-sectional view of a plasma processing chamber employing a four-turn 30-cm-diam helical coil matched with an impedance at the 13.56 MHz drive frequency according to the present invention.

Referring now to FIG. 1, a first embodiment of a plasma processing system according to the present invention consisting of multiturn helical coil managed to match with an impedance at the 13.56 MHz drive frequency is illustrated. This processing system includes a vacuum chamber 10 shaped like a hollow cylindrical body having a side 12, a bottom 14, and an upper flange 16 which defines an aperture at the center thereof. A viewing window 20 is formed at a location 18 of the side. A gas inlet port 22 is provided on the flange 16 at a location near the side 12. A dielectric structure 28 spans the aperture of the flange 16 and is preferably made of a ceramic such as aluminum oxide or quartz. Sealing of these elements of vacuum chamber 10 is provided by conventional gaskets (not shown).

A suitable gas that can be excited to a plasma is supplied to the interior of the chamber 10 from a gas source (not shown) via the port 22. The interior of the chamber 10 is maintained in a vacuum condition at a pressure that can vary in the range of 0.001–100 milliTorr by a vacuum pump (not shown). The gas in vacuum chamber 10 is excited to a planar plasma by a suitable electric source. The electric source includes an RF source 38, a matching network 36 and a 30-cm-diam substantially helical coil 26 consisting of four turns of ¼-inch-diam copper tubing mounted immediately above the dielectric structure 28. The coil 26 is excited by the RF source 38 via the matching network 36 that is resonant to the frequency of the RF source 38. The matching network 36 includes output terminals 40 and 42, one of which 40 is electrically connected to the lowest turn of the coil 26 via a line 44 and grounded. The terminal 42 is electrically connected to the upper turn of the coil 26 via a line 46. Typically, the RF source 38 has a frequency of 13.56 MHz which is sufficiently high so that coil 26 exhibits transmission line properties.

The induction magnetic field is a function of the sum of the fields produced by each of the turns of the coil. The field produced by each of the turns is a function of the magnitude of RF current in each turn. Hence, higher induction power density and more effective reduction of capacitive coupling may be attained by using a multiturn coil. The matching network has limitations to tune the larger self-inductance of a multiturn coil of the helical design disclosed by Frogotson, in which the matching network could not properly tune the larger self-inductance of a three-turn 24-cm-diam helical coil with 6 mm cross sectional diameter at the 13.56 MHz drive frequency. In the first embodiment of the present invention shown in FIG. 1, the plasma processing chamber 10 employing a four-turn 30-cm-diam helical coil 26 is successfully to match with an impedance at the same frequency of an RF source.

A wafer support assembly is disposed generally centrally within the chamber 10 and underneath of the ceramic dielectric window 28, which includes a supporting rod 34 and a supporting platform 32 set on the top of the supporting rod 34. The supporting rod 34 includes a ceramic isolation 52 extending through the bottom 14 via an appropriate vacuum seal (not shown). The supporting platform 32 may be protected by an RF shield 50, on which a wafer 30 to be treated is supported. The wafer 30 having a major upper surface disposed spaced from the ceramic dielectric window 28 by a distance D in the range of 5–10 cm. The support platform 32 as an RF bias electrode is connected to an RF source 48. The chamber side 12 is connected to ground. The RF sources 38 and 48 are all the industry standard frequency of 13.56 MHz. Other frequencies in the kHz to MHz range can also be used. Cooling of the supporting platform 32 is provided through coolant jackets (not shown). A cylindrical metal frame 24 is set atop the flange 16 surrounding the coil 26 so as to provide an electromagnetic enclosure for the coil 26.

Figure 2:
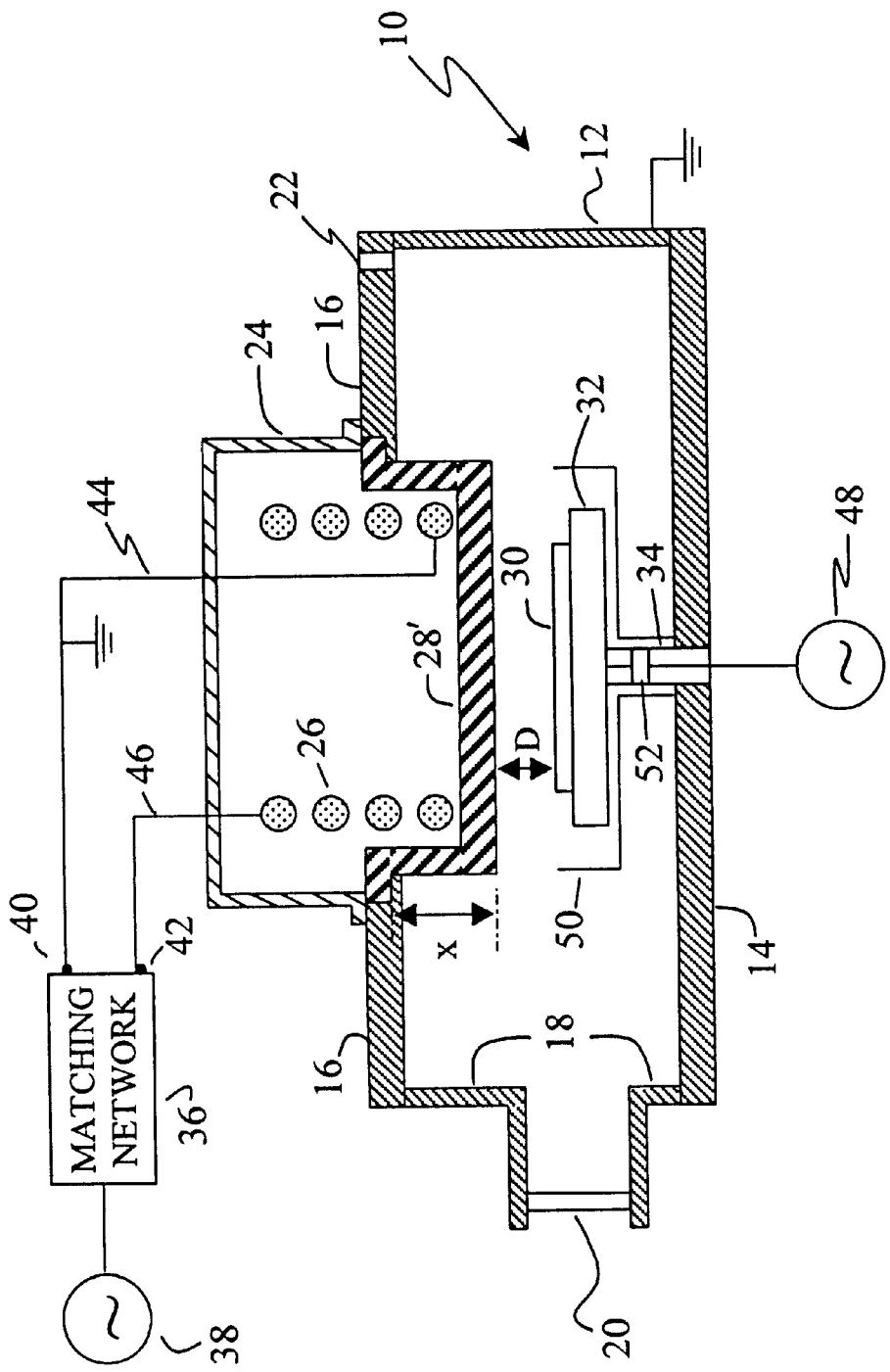
FIG. 2 is a side cross-sectional view of a plasma processing chamber of the present invention employing a can-like dielectric.

An RF induction plasma using a helical coil design with a can-like ceramic dielectric according to a second embodiment of the present invention are shown in FIG. 2, in which like elements and parts as shown in FIG. 1 are represented by like numerals. The dielectric 28' spans on the aperture in the flange 16, and the bottom of the dielectric 28' extends into the chamber 10 with a depth of x, wherein 0<x<10 cm. Preferably, the depth x ranges from 0 cm to 5 cm. Comparing to the apparatus described by Jacob, the dielectric 28' acts as to reduce the effect of capacitive coupling between the coil and the vessel walls, thus mitigate the contamination problem from the vessel walls to some extent. The distance between the dielectric 28' and the wafer 30 as shown in FIG. 2 can be easily adjusted by selecting a can-like ceramic dielectric having a different depth x. The apparatus shown in FIG. 2 is particularly suitable for a plasma treating at very low pressure, for example in the 0.001 to 10 miliTorr range, preferably 0.01. to 1.0 miliTorr range, in which an RF induction plasma is prompted to approach the wafer surface. The use of this adjustment yields an extremely high flux of ionic species, and thus results in a rapid anisotropic etching under relatively low power voltage.

The second embodiment of the present invention apparently can reduce the capacitive coupling and improve induction power density. The superior performance of this embodiment of the present invention on the etch rate of GaN will be described as follows.

The GaN sample 30 was put on the platform 32, and thereafter a residual gas in the reaction chamber 10 with distance D of 7.5 cm (x is 2.5 cm) was reduced to about $5 \times 10^{-6}$ Torr. Thereafter, a gas mixture of $Cl_2/BCl_3$ was introduced into the reaction chamber 10 from the port 22 at a flow rate of 20/10 sccm by the mass flow controller, and the degree of vacuum of the reaction chamber 10 was adjusted accurately to $1 \times 10^{-2}$ Torr. Then RF source power of 1000 W and bias power of 40 W were supplied, a glow discharge was started between the dielectric 28 and the supporting platform 32, the introduced $Cl_2/BCl_3$ gas was induced to the plasma state, and etching of the sample 30 was started. After etching for 2 minutes, the sample 30 was pulled out from the reaction chamber 10 and the mask was removed before measurement. Results indicate that the etch rate of GaN is above 3,500 Å/min. As a result, a high etch rate and good anisotropy of GaN was got.

Low capacitive coupling, high induction power density and uniformity of plasma density brought about a high etch rate and good anisotropy of GaN observed in experiments using the apparatus shown in FIG. 2 of this invention.

At intermediate pressures, in the 10 to 100 miliTorr range, gas phase collisions of electrons, ions, and neutrons in the plasma prevent a substantial diffusion of the plasma charged particles outside of the annular region. As a result there is a relatively high plasma flux in the ring like region of the wafer but low plasma fluxes in the center and peripheral portions of the wafer. As described in the Background Art, one technique for solving the problem of plasma generation uniformity in a chamber is to raise its ceiling to a height greater than 10 cm. But while this does improve the uniformity of plasma distribution, it so increases the chamber volume and diffusion distance to the wafer as to remove the advantage of a small volume chamber. This seemingly intractable problem of non-uniform distribution of reactive species can be solved in a third embodiment of the present invention shown in FIG. 3.

Figure 3:
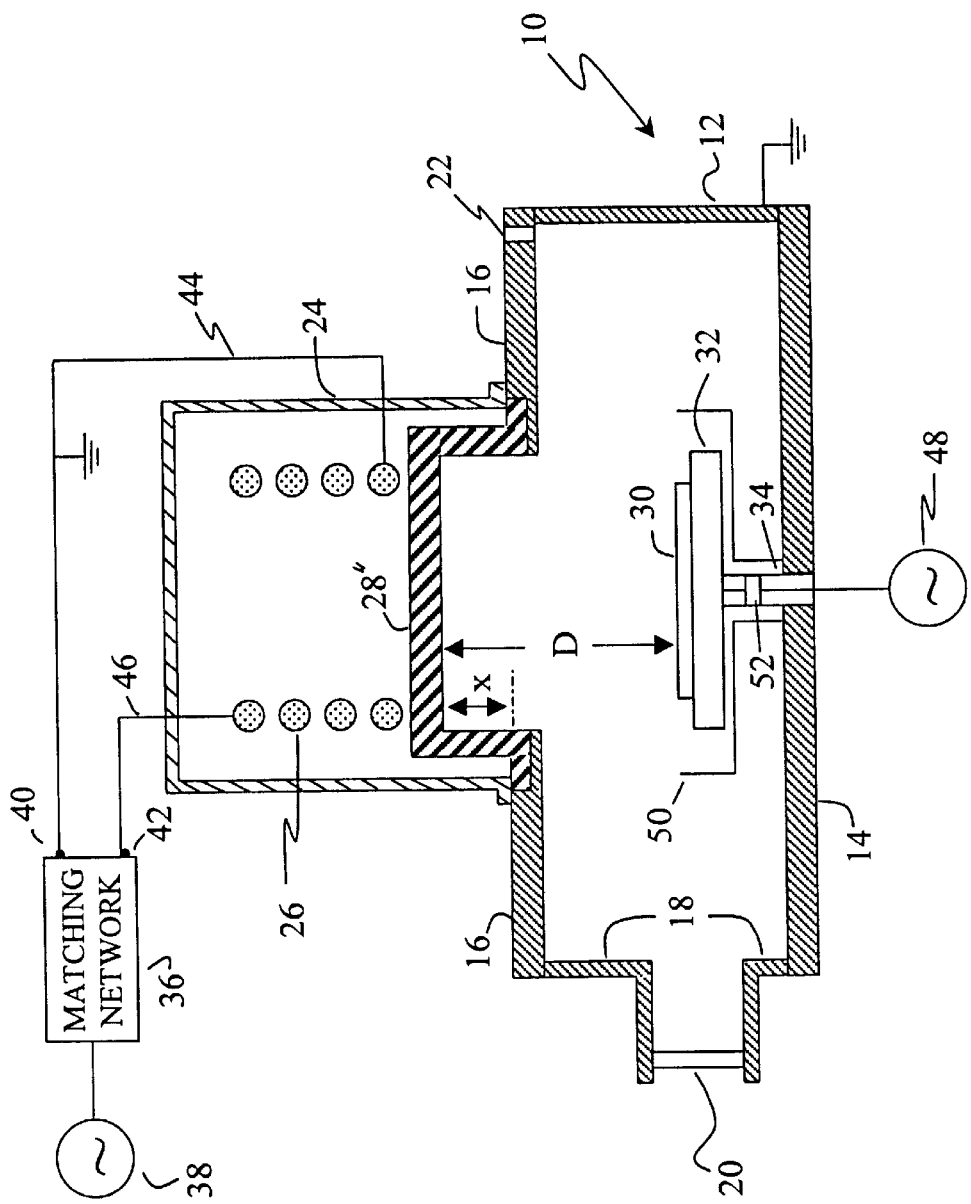
FIG. 3 is a side cross-sectional view of a plasma processing chamber of the present invention employing a cap-like dielectric.

Contrary to the can-like dielectric 28' shown in FIG. 2, a cap-like dielectric 28" is used in the third embodiment shown in FIG. 3. In FIG. 3 the elements and parts which are similar to those in FIG. 2 are designated by the same numerals. The cap-like dielectric 28" spans on the aperture in the flange 16, and the top thereof extends into the cylindrical metal frame 24 with a height of x ranging from 0 to 10 cm, so as to increase the distance between the coil antenna 26 and the vacuum chamber 10 with a value x. In accordance with the third embodiment of the present invention, the dielectric 28" is to provide a means to improve the uniformity of the plasma density without increasing the chamber volume much, and to approach optimal uniformity across the wafer surface. In one of the experiments carried out in the plasma processing system shown in FIG. 3 with the test conditions of 750 W, 10 milliTorr, and Ar of 40 sccm, the inductively coupled plasma in the chamber (D is 12.5 cm and x is 2.5 cm) have a high peak ion density of $5 \times 10^{11}$ cm$^{-3}$ at 6 cm below the dielectric. The diagonal uniformity over 20 cm achieves 15%.

The present invention can be utilized in the field of plasma processing, and particularly in the fields of etching and deposition on semiconductor wafers.

While the present invention has been described with respect to specific embodiments, numerous changes, modifications and improvements falling within the scope and spirit of the invention will occur to those skilled in the art.

What is claimed is:

1. An inductively coupled plasma processing chamber comprising:

a dielectric window having a planar base and an integrally formed upright wall surrounding the planar base, wherein said upright wall of the dielectric window protrudes perpendicularly from the planar base, and further comprising a chamber body, in which a free end of the upright wall of the dielectric window is hermetically connected to the chamber body to provide a plasma generation space confined by the dielectric window and the chamber body.

2. The inductively coupled plasma processing chamber according to claim 1 wherein the dielectric window is cylindrical.

3. The inductively coupled plasma processing chamber according to claim 1, wherein the upright wall has a height from the planar base less than 10 cm.

4. The inductively coupled plasma processing chamber according to claim 3, wherein the upright wall has a height from the planar base less than 5 cm.

5. The inductively coupled plasma processing chamber according to claim 1, wherein the chamber body comprises a bottom plate, an upright side wall surrounding the bottom, and a flange at a free end of the upright side wall, wherein the flange extends inwardly from the upright side wall so as to form an aperture above the bottom plate, wherein the dielectric window hermetically seals the aperture.

6. The inductively coupled plasma processing chamber according to claim 1, wherein the dielectric window is hermetically connected to the chamber body so that the planar base of the dielectric window protrudes from the chamber body.

7. The inductively coupled plasma processing chamber according to claim 1, wherein the dielectric window is hermetically connected to the chamber body so that the planar base of the dielectric window extends into the chamber body.

8. The inductively coupled plasma processing chamber according to claim 5, wherein the dielectric window is hermetically connected to the chamber body so that the planar base of the dielectric window protrudes from the chamber body.

9. The inductively coupled plasma processing chamber according to claim 5, wherein the dielectric window is hermetically connected to the chamber body so that the planar base of the dielectric window extends into the chamber body.

10. The inductively coupled plasma processing chamber according to claim 1, wherein the dielectric window is made of a ceramic material or quartz.

11. The inductively coupled plasma processing chamber according to claim 1 further comprising a coil disposed adjacent to the planar base of the dielectric window for bringing about an inductively coupled plasma.

12. The inductively coupled plasma processing chamber according to claim 11, wherein the coil is a helical coil and the dielectric window is cylindrical, wherein the helical coil is coaxially disposed adjacent to the planar base of the dielectric window.

* * * * *